(12) United States Patent
Makhotkin et al.

(10) Patent No.: US 7,404,986 B2
(45) Date of Patent: Jul. 29, 2008

(54) MULTI-COMPONENT DEPOSITION

(75) Inventors: Alexander V. Makhotkin, Kiev (UA);
Igor S. Malashenko, Kiev (UA); Igor V. Belousov, Kiev (UA)

(73) Assignee: United Technologies Corporation, Hartford, CT (US)

( * ) Notice: Subject to any disclaimer, the term of this patent is extended or adjusted under 35 U.S.C. 154(b) by 638 days.

(21) Appl. No.: 10/840,859

(22) Filed: May 7, 2004

(65) Prior Publication Data

US 2005/0249888 A1    Nov. 10, 2005

(51) Int. Cl.
*C23C 16/06* (2006.01)
(52) U.S. Cl. ...................................... 427/250
(58) Field of Classification Search ............... 427/248.1, 427/585, 578
See application file for complete search history.

(56) References Cited

U.S. PATENT DOCUMENTS

| | | | |
|---|---|---|---|
| 4,008,844 A | 2/1977 | Duvall et al. | |
| 4,073,639 A | 2/1978 | Duvall et al. | |
| 4,822,248 A | 4/1989 | Wertz et al. | |
| 5,106,010 A | 4/1992 | Stueber et al. | |
| 5,451,142 A | 9/1995 | Cetel et al. | |
| 5,525,429 A | 6/1996 | Mannava et al. | |
| 5,549,767 A | 8/1996 | Pietruska et al. | |
| 5,732,467 A | 3/1998 | White et al. | |
| 5,783,318 A | 7/1998 | Biondo et al. | |
| 5,794,338 A | 8/1998 | Bowden, Jr. et al. | |
| 5,846,608 A | 12/1998 | Neumann et al. | |
| 6,049,978 A | 4/2000 | Arnold | |
| 6,302,625 B1 | 10/2001 | Carey et al. | |
| 6,364,956 B1 * | 4/2002 | Wang et al. | 118/726 |
| 6,521,302 B1 * | 2/2003 | Campana-Schmitt et al. | 427/574 |
| 6,620,518 B2 | 9/2003 | Lavery et al. | |
| 6,638,580 B2 | 10/2003 | Gavish | |
| 2002/0076573 A1* | 6/2002 | Neal et al. | 428/621 |
| 2002/0182343 A1* | 12/2002 | Yuda et al. | 427/569 |
| 2003/0056716 A1 | 3/2003 | Johnson | |
| 2005/0029089 A1 | 2/2005 | Wang et al. | |

FOREIGN PATENT DOCUMENTS

| | | | |
|---|---|---|---|
| DE | 42 39 511 | * | 5/1994 |
| EP | 1325969 A2 | | 7/2003 |
| EP | 1 394 283 A1 | | 3/2004 |
| JP | 03-173775 | * | 7/1991 |
| JP | 5-341145 | | 12/1993 |
| JP | 06306613 | * | 11/1994 |
| JP | 2005341145 | | 12/2005 |
| SU | 430195 | | 5/1974 |

(Continued)

OTHER PUBLICATIONS

European Search Report for EP Application No. 05252802.

(Continued)

*Primary Examiner*—Timothy Meeks
*Assistant Examiner*—Elizabeth A Burkhart
(74) *Attorney, Agent, or Firm*—Bachman & LaPointe, P.C.

(57) ABSTRACT

Physical vapor deposition is augmented by chemical vapor deposition from one or more organometallic compounds to deposit multi-component materials. The organometallic compounds may be carbonyls. The process may be used to deposit coatings and repair material on superalloy turbine engine parts.

38 Claims, 2 Drawing Sheets

FOREIGN PATENT DOCUMENTS

| | | | |
|---|---|---|---|
| SU | 430195 | * | 10/1974 |
| WO | WO 99/42637 A1 | | 8/1999 |
| WO | 03/028428 A2 | | 4/2003 |
| WO | WO 2004/011688 A2 | | 2/2004 |

OTHER PUBLICATIONS

Duane G. Williams, Vacuum Coating with a Hollow Cathode Source, J. Vac. Sci. Technol., Jan.-Feb. 1974, New York.

Patent Abstracts of Japan, vol. 122, No. 2, Jun. 10, 1988—JP 63004066 (Hitachi Ltd.).

J.R. Treglio et al., Deposition of TiB2 at Low Temperature with Low Residual Stress Vacuum Arc Plasma Source, Surface and Coatings Technology; Dec. 3, 1993, Elsevier Sequoia SA, Switzerland.

Patent Abstracts of Japan, Publication No. 03-173775, published Jul. 29, 1991, NEC Corp.

Russian Office Action for RU Patent Application No. 2005113956.

* cited by examiner

MULTI-COMPONENT DEPOSITION

CROSS-REFERENCE TO RELATED APPLICATIONS

Copending U.S. patent application Ser. No. 10/377,954, filed Mar. 3, 2003, and entitled "Fan and Compressor Blade Dovetail Restoration Process", Ser. No. 10/635,694, filed Aug. 5, 2003, and entitled "Turbine Element Repair", Ser. No. 10/734,696, filed Dec. 12, 2003, and entitled "Turbine Element Repair", and Ser. No. 10/804,754 filed Mar. 19, 2004 and entitled "Multi-Component Deposition" disclose apparatus and methods to which the present invention maybe applied. Applications Ser. Nos. 10/377,954, 10/635,694, 10/734,696, and 10/804,754 are incorporated herein in their entireties by reference as if set forth at length. Benefit of these applications under 35 USC 120 is not claimed.

BACKGROUND OF THE INVENTION (1) Field of the Invention

The invention relates to the restoration of turbomachine parts. More particularly, the invention relates to the restoration of worn or damaged gas turbine engine blades and other blades and vanes.

(2) Description of the Related Art

The components of gas turbine engines are subject to wear and damage. Even moderate wear and damage of certain components may interfere with optimal operation of the engine. Particular areas of concern involve the airfoils of various blades and vanes. Wear and damage may interfere with their aerodynamic efficiency, produce dynamic force imbalances, and even structurally compromise the worn/damaged parts in more extreme cases. A limited reconditioning is commonly practiced for slightly worn or damaged airfoils wherein additional material is removed below the wear/damage to provide the airfoil with a relatively efficient and clean sectional profile albeit smaller than the original or prior profile. Exemplary inspection criteria establishing the limits to which such reconditioning can be made are shown in Pratt & Whitney JT8D Engine Manual (P/N 773128), ATA 72-33-21, Inspection-01, United Technologies Corp., East Hartford Conn. Such limits may differ among airfoils depending upon the location and particular application. The limits are typically based on structural and performance considerations which limit the amount of material that may be removed.

Various techniques have been proposed for more extensive restoration of worn or damaged parts of gas turbine engines. U.S. Pat. No. 4,822,248 discloses use of a plasma torch to deposit nickel- or cobalt-based superalloy material. U.S. Pat. No. 5,732,467 identifies the use of high velocity oxy-fuel (HVOF) and low pressure plasma spray (LPPS) techniques for repairing cracks in such turbine elements. U.S. Pat. No. 5,783,318 also identifies LPPS techniques in addition to laser welding and plasma transferred arc welding. U.S. Pat. No. 6,049,978 identifies further use of HVOF techniques. Such techniques have offered a limited ability to build up replacement material to restore an original or near original cross-section. However, the structural properties of the replacement material may be substantially limited relative to those of the base material.

Especially for larger damage, it is known to use preformed inserts which may be welded in place to repair damage. With such inserts, the damaged area is cut away to the predetermined shape of the insert which is, in turn, welded in place. Structural limits associated with the welding limit the capability of such repair techniques to relatively low stress regions of the airfoil as with other techniques. It is common for engine repair manuals to specify the low stress areas where weld repair is permissible. Thus substantial combinations of the extent of the wear/damage and the stress to which the worn/damaged area is subject may limit use of such techniques.

SUMMARY OF THE INVENTION

One aspect of the invention involves a method for depositing a deposition material on a part. The part is placed in a deposition chamber. One or more first components for forming the deposition material are vaporized by electron beam heating. One or more organometallic compounds are vaporized for providing one or more second components of the deposition material being co-deposited on the part with the first components.

In various implementations, evaporated components of the deposition material may be ionized. The ionization may be via pulse-modulated ion-enhanced EBPVD. The temperature of the part may be actively controlled to, in turn, control dissociation of the one or more organometallic compounds. The part may subsequently be heat treated so as to homogenize the deposited deposition material. The temperature of the part may be maintained between 600 C and 1050 C, more narrowly 600 C and 900 C. The vaporizing of the one or more organometallic compounds may comprise heating to between 45 C and 120 C, more narrowly, 50 C and 80 C. The one or more organometallic compounds may comprise, at least 50%, carbonyls of one or more refractory elements. The vaporizing of the one or more first components may comprise vaporizing at least one M-Cr—Al—Ti alloy and the deposition material may consist essentially of a nickel- or cobalt-based superalloy. The one or more first components may consist in major part of Ti and the one or more second components may consist essentially of Mo. The deposition material may consist essentially of at least one of a nickel-or cobalt-based superalloy with 2-20% refractory metal addition. The deposition material may consist essentially of: at least one M-Cr—Al—Ti alloy; 2-20% combined of one or more of W, Mo, Re, Pt, Rh, Ru, Os, Ir, Te, and V; and 0-0.3% C.

The part may have lost first material from a site and the deposition material may be deposited to the site so as to restore the part. The deposition material may have a first interface with a substrate of the part, a bond strength between the deposition material and the substrate being in excess of 50 ksi (e.g., between 60 ksi and 90 ksi). The part and the deposition material may comprise nickel- or cobalt-based superalloys of like nominal composition and having 2-20% refractory metal The substrate may have a thickness in excess of the depth of the deposition material. The substrate may comprise original unrepaired material. The deposition material may have a depth of at least 2.0 mm at the site (e.g., in a localized foreign object damage repair situation). The deposition material may have an average depth of less than 0.75 mm. A maximum depth may also be similarly small (e.g., in an erosion-only repair situation). A mask may be applied to a portion of the part surrounding the site prior to deposition and the mask may be removed after the deposition. The vaporized one or more organometallic compounds may be permitted to condense on the part and the deposition surface on the part may be irradiated via an electron beam to cause non-thermal dissociation of the one or more organometallic compounds leaving one or more refractory metals as said one or more second components.

Another aspect of the invention involves an apparatus for depositing material on a workpiece. A deposition chamber contains the workpiece. There are means for vaporizing one or more first deposition material components. There are means for vaporizing one or more organometallic compounds for providing one or more second deposition material components. There is a control system coupled to the means for vaporizing one or more first deposition material components and the means for vaporizing one or more organometallic compounds and programmed so as to provide feedback loop control of codeposition of the first and second deposition material components to the workpiece.

In various implementations, there may be means for monitoring a temperature of the workpiece. There may be means for generating a plasma from one or more of the vaporized first deposition material components and/or the organometallic compounds. There may be means for applying a modulated bias electric potential to the workpiece to draw ions from the plasma to the workpiece. The means for vaporizing the one or more first deposition material components may comprise an electron beam source directing an electron beam toward an ingot comprising the one or more first deposition material components and lacking ion-enhancement. The means for vaporizing the one or more organometallic compounds may comprise a conductive heater for heating the one or more organometallic compounds. The control system may be programmed to provide a progressively varying balance between the one or more first deposition material components and the one or more second deposition material components across a thickness of the deposited material so as to form a predetermined graded composition in the deposited material.

Another aspect of the invention involves an apparatus for depositing deposition material on a workpiece. A deposition chamber contains the workpiece. A first source of one or more first components of the deposition material is heated so as to vaporize the first components. A second source comprising one or more organometallic compounds provides one or more second components of the deposition material.

In various implementations, the one or more first components may include: at least 50% of one or a combination of Ni, Co and Fe; at least 12% Cr; at least 6% Al; and at least 0.5% Ti. The one or more second components may consist essentially of one or more refractory metals and up to 0.3% C. The one or more first components may include at least 50% Ti and the one or more second components may consist essentially of one or more refractory metals and up to 0.1% C.

Another aspect of the invention involves a method for codepositing one or more first components and one or more second components. The one or more first components are electron beam physical vapor depositied. The one or more second components are chemical vapor deposited from an organometallic compound.

In various implementations, the first components may comprise: at least 50% of one or a combination of Ni, Co, and Fe; at least 12% Cr; at least 6% Al; and at least 0.5% Ti. The one or more first components may be from a single ingot. The one or more second components may be at least two refractory metal components from at least two different sources of different composition.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
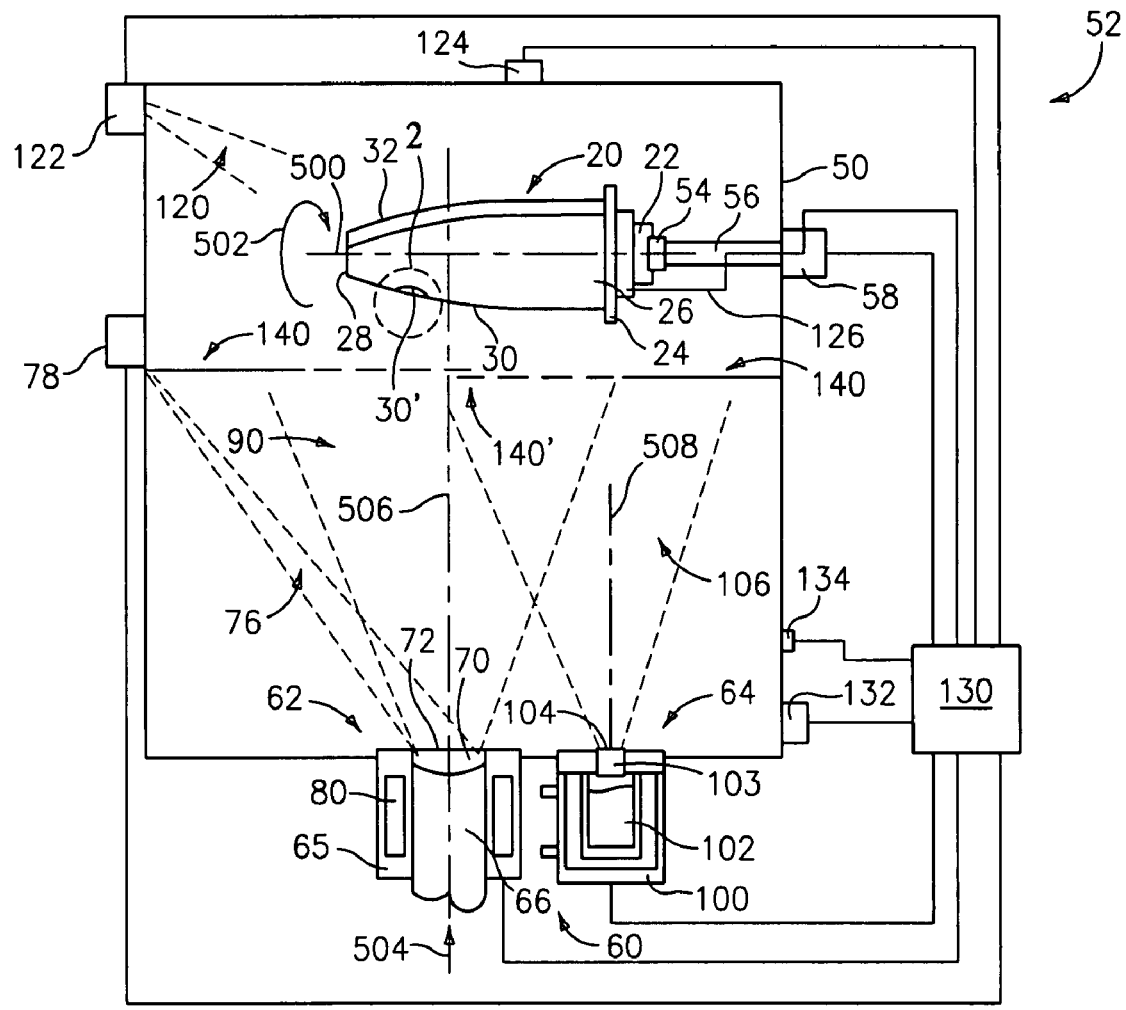
FIG. 1 is a partially schematic view of a turbine engine blade in a repair apparatus according to principles of the invention.

FIG. 1 shows a blade 20 from a gas turbine engine. The blade has an inboard blade root 22 configured for attaching the blade to a disk (not shown). A platform 24 separates the blade root from an airfoil 26 extending from the platform to a tip 28. The airfoil has a leading edge 30 and a trailing edge 32 with suction and pressure sides extending therebetween.

FIG. 1 shows the airfoil having localized damage such as is associated with foreign object damage (FOD) nicking or chipping the airfoil proximate the leading edge to create a damaged leading portion 30'. Alternatively there may be more general damage such as a broadly-eroded leading edge. The damage site is advantageously cleaned of contamination. Further removal of base material may provide an advantageous base surface for receiving deposition. For example, after the damage/wear, the remaining base material of the blade may be locally or broadly ground to a preset configuration such as providing an angled leading facet or base surface as in U.S. patent application Ser. No. 10/635,694 (the '694 application).

Figure 2:
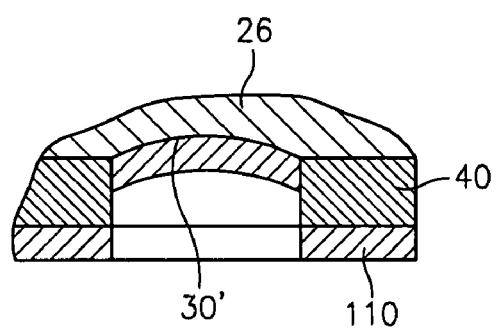
FIG. 2 is a view of a damaged area of the blade of FIG. 1.

In an optional illustrated variation, a mask element 40 (FIG. 2) is secured to the airfoil surrounding the damaged leading edge portion 30'. In the exemplary embodiment, the mask may be a metallic (e.g., stainless steel) foil. Alternatively or additionally, a scaffold/mask may be used as in the '694 application. Alternatively, the mask may be spaced-apart from the adjacent surface of the airfoil.

The blade may then be positioned in a chamber 50 of a deposition apparatus 52. In the exemplary embodiment, the blade is held by a clamp 54 at the distal end of a shaft 56 whose proximal end is connected to a drive motor 58. The exemplary clamp engages the blade root 22. The motor 58 may selectively rotate the blade about an axis 500 in a direction 502 or opposite thereto. Alternative holding means may be provided including fixed fixtures and means with other forms of rotation, translation, or more complex movement. An exemplary deposition material source 60 takes the form of first and second sources 62 and 64 of first and second deposition material components, respectively. The first source may operate in a similar fashion to those shown in the aforementioned Ser. Nos. 10/377,954, 10/635,694, 10/734,696, and 10/804,754 applications. The exemplary illustrated first source 62 comprises a crucible 65 having at least a first end exposed to an interior of the chamber 50. An ingot 66 is progressively fed through the crucible along a direction of insertion 504 (parallel to a first source axis 506) toward the vessel interior.

Appropriate seals may be provided to prevent leakage around the ingot. Alternatively, the ingot and its progressive movement actuator (not shown) may be located within the chamber 50. The inboard end of the ingot 66 becomes positioned within the crucible 65 along a bottom one of the walls defining the chamber. A molten pool 70 of metal from the ingot is formed within the crucible and has a surface or meniscus 72. The ingot is melted to provide the pool via an electron beam 76 emitted from an electron gun 78 which may be positioned within or without the chamber to direct the beam to the inboard ingot end/pool. The crucible serves to contain the pool. The crucible is advantageously cooled to keep it from melting (e.g., by passing a cooling fluid such as water through an external cooling jacket 80).

The heating by the electron beam is effective to vaporize the metal in the pool. The kinetics of the vaporization may be effective to direct a flow 90 of metal vapor from the surface 72 toward the blade. The exemplary flow 90 is centered on the axis 506. The exemplary ingot materials are alloys mainly comprising one or more of nickel, cobalt and iron with chromium; aluminum; and titanium commonly identified as M-Cr—Al—Ti. For example, nickel-based superalloys having concentrations of: cobalt and/or iron; chromium; and aluminum commonly identified as Ni—Co(Fe)—Cr—Al—Ti alloys may be used. Titanium-based alloys, including concentrations of Al and V may alternatively be used.

A second source 64 may be used to provide second components that have sufficiently different properties from the first components that attempting to include such second components in the ingot would prevent or hinder deposition in the desired proportions from a single ingot. The exemplary second components include refractory metals. The exemplary second source 64 includes a vessel 100 containing one or more organometallic compounds (OMCs) 102 comprising the desired refractory elements. An exemplary vessel is double-walled, having a inner chamber containing the OMC and an outer chamber surrounding the inner chamber and containing a flow of a heated heat transfer fluid to heat the inner chamber. Exemplary organometallic compounds include carbonyls of the refractory metal(s) (e.g., $W(CO)_6$, $Mo(CO)_6$, and $Re_2(CO)_{10}$. The vessel may be heated (e.g., to 45-120 C, more narrowly 50-80 C) to vaporize the carbonyl molecules and has a discharge valve 103 with an outlet 104 positioned to direct an outlet flow 106 of the carbonyl vapor toward the blade. If the second source vessel is at least partially outside the chamber, the discharge valve may be positioned to permit refilling of the second source without releasing the chamber vacuum. For example, an elongate discharge conduit carrying the discharge valve may extend from the vessel and penetrate the chamber. The exemplary flow 106 has a centerline/axis 508 which may be parallel to the axis 506 or convergent therewith toward the blade 20. Simultaneous deposition of material from the metal and carbonyl flows occurs over a desired coverage area of the blade. The flows mix by free molecular dispersion or by diffusion depending on evaporation rates. In the illustrated embodiment, the exemplary flows of the first component and the carbonyls individually diverge to form a pair of plumes. The plumes may, advantageously, converge relative to each other with diffusion mixing so as to so as to overlap at least along a desired coverage area of the blade. The flows gradually build up a deposition material layer 110 on the desired surface of the blade and on the mask. In the exemplary embodiment, the blade may be continuously or reciprocally rotated for evenness of coverage or to deposit at multiple sites. Advantageously, the carbon monoxide of the carbonyls is removed from the deposition material surface in the form of a gas, largely leaving the refractory metal(s) as the second component(s). To achieve this, advantageously the blade temperature is kept high enough to provide the corresponding necessary minimum temperature level for such evaporation. Control of the carbon content of the deposition material may be achieved by ionization of the deposition material components and hence by partial dissociation of the OMCs before reaching the deposition surface. The ionization may reduce defects and increase deposition material density. The heating may be achieved by an electron beam 120 delivered by a second electron gun 122. The blade temperature may be measured such as by a remote temperature sensor 124 (e.g., an infrared sensor) or a contact sensor 126 (e.g., a thermocouple). Such sensors may be connected via appropriate communication lines to a control system 130 which may also be connected to the electron guns, the sources, and the motor. The control system 130 may be connected to other equipment such as a vacuum pump 132 for maintaining a vacuum within the chamber and additional sensors such as a chamber pressure sensor 134. Mass flow control for the carbonyl flow may be achieved by throttling of the discharge valve under control of the control system. The control system may be programmed to provide feedback loop control of the deposition process. This may include absolute and relative deposition rates of individual components and of other properties (e.g. temperatures, pressures, and the like) that may influence the chemical and physical properties of the deposited material. The feedback loop may be responsive to various directly measured and/or calculated parameters. For example, the system may be programmed to maintain a constant rate of organmetallic compound evaporation. The flow rate of evaporated organometallic compounds can be measured by a flow metering system (e.g., using a conventional calorimetric system). The control system may use a flux value (e.g., liters per minute) to vary the CVD source temperature so as to maintain a desired balance between EBPVD and CVD fluxes to maintain a fixed deposition material chemistry. Alternatively, a composition gradient may be imposed across all or a portion of the deposition material depth.

A shutter system 140 may have a first position (solid line) clear of the flowpaths from the sources to the blade and a second position (broken line) 140' blocking the flowpaths. The shutter may be in the second position during preparation as the apparatus is brought up to initial target operating conditions. During this stage, the ingot material is melted to form the pool, the OMC is heated to a target operating temperature range with the discharge valve 103 closed, and the blade may be preheated to a target operating temperature range by the second electron gun (e.g., with the beam 120). The preheating may serve to clean the deposition surface by pyrolysis and desorption of surface impurities. With the parameters in the initial target ranges, the shutter and discharge valve are opened to expose the blade to deposition. During deposition, the blade may be heated by the second electron gun 122 by heat radiation (e.g., from the melted metal in the pool), and by the latent heat of condensation. The second electron gun is turned off if the temperature exceeds the maximum of an operational target range and may be turned off so long as the temperature is within the target range. It may, however, be switched back on if the temperature falls below a minimum of the target range. A post-deposition heat treatment may further homogenize the deposition material and integrate the deposition material with the substrate.

EXAMPLE

The exemplary ingot is a 70 mm diameter right circular cylinder of 59% Ni, 15% Cr, 12% Co, 9% Al, 3% Ti alloy. The electron gun heating the ingot is operated at 20 kV and 1.9A. $W(CO)_6$ OMC is heated in a copper vessel by 65 C circulating water. The vessel outlet is a 6 mm diameter circular orifice. The source centerline separation is 150 mm. The source-substrate separation is 300 mm. The substrate receiving the deposition is alternatively formed of 15.7% Cr, 11% Co, 1.5%

Mo, 5.5% W, 2.7% Al, 4.7% Ti, 0.2% Nb, 0.1% C, remainder Ni plus impurities and 5.5% Cr, 10.3% Co, 1.6% Mo, 5.5% W, 8.4% Ta, 2.4% Re, 6.5% Al, 0.05% Ti, 0.03% Hf, 0.1% C, remainder Ni plus impurities, nominal composition by weight. The substrate temperature is maintained at a nominal 850 C. Deposition material composition exactly between the centerlines was measured as 65.0% Ni, 19.1% Cr, 6.6% Al, 8.0% W, 0.09% C. Deposition material composition at the first source centerline was measured as 58.0% Ni, 14.2% Cr, 11.5% Co, 8.9% Al, 2.7% Ti, 3.0% W, 0.13% C. Deposition material composition at the second source centerline was measured as 53.1% Ni, 10.6% Cr, 6.8% Al, 2.3% Ti, 13.2% W, 0.15% C.

Figure 3:
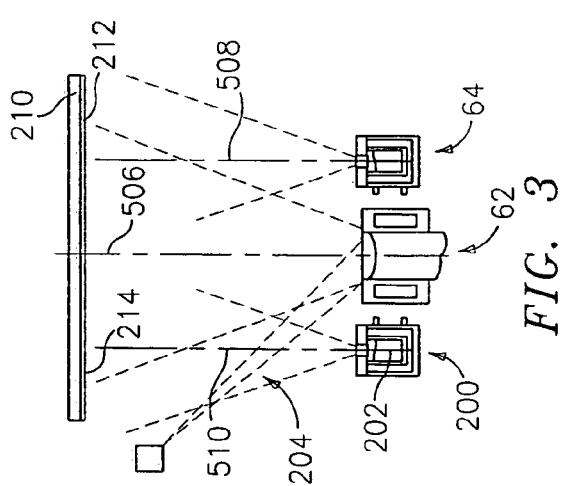
FIG. 3 is a partially schematic view of a second deposition apparatus.

FIG. 3 shows the addition of a third source 200 which may be added to the first source 62 and the second source 64. The third source 200 may be similar to the second source 64 but containing a different organometallic compound 202 and discharging a flow 204 of that compound along an axis 510. FIG. 3 more generically shows the workpiece as a plate 210 instead of the blade. The workpiece receives a deposition material 212 atop its exposed surface 214. The deposition material includes first components from the first source 62 and second components from the second and third sources 64 and 200. The exemplary materials deposited by such a system include superalloys with substantial concentrations of W and Mo simultaneously (e.g., at least 2%). One exemplary specific deposition material is 52.8% Ni, 15.0% Cr, 7.0% Al, 2.0% Ti, 8.2% W, 4.1% Mo, 0.16% C. Alternatively, the second and third sources may be of similar material to provide deposition evenness.

Figure 4:
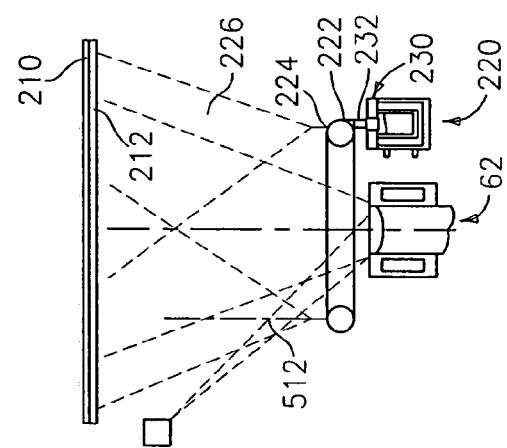
FIG. 4 is a partially schematic view of a third deposition apparatus.

FIG. 4 shows a system similar to that of FIGS. 1 and 3 but wherein the second source 220 is formed having an annular discharge manifold 222 encircling the flow from the first source 62 and having an outlet 224 in the form of an annular slot or an annular aperture/nozzle array discharging an initially annular flow 226 (having a half-section centerline 512) of the organometallic vapor. The manifold is coupled to the vessel 230 by a conduit/tube 232. The annular flow collapses as flow portions from diametrically opposite portions of the manifold merge along a system centerline coincident with a centerline of the first source 62 and its flow.

Figure 5:
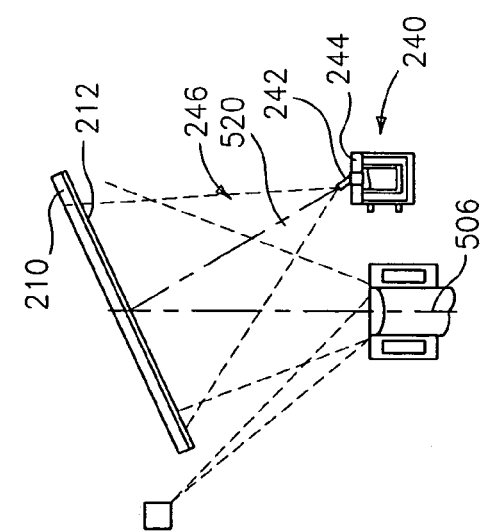
FIG. 5 is a partially schematic view of a fourth deposition apparatus.

FIG. 5 shows an alternate system wherein the workpiece 210 is held at an angle off-normal to the first source centerline. The second source 240 has a short discharge conduit 242 extending from the outlet of the vessel 244. The second source flow 246 has a centerline/axis 520 intersecting the first source centerline/axis for better flow overlap at the workpiece.

Figure 6:
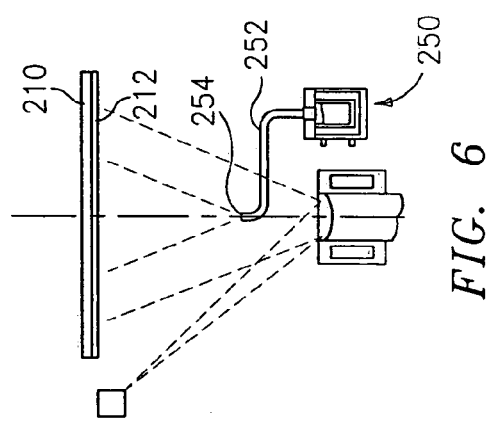
FIG. 6 is a partially schematic view of a fifth deposition apparatus.

FIG. 6 shows an alternate system wherein the second source 250 discharges its flow coaxially within the metal vapor flow. Its elongate outlet conduit 252 extends within the metal vapor flow so that a carbonyl exiting the outlet 254 of the conduit 252 becomes entrained in the flow from the first source. Such a system may provide a more intimate and homogenous mixing of flows from the two sources. Alternatively the outlet 254 may be positioned within the first source flow but directed so that its own flow centerline is parallel/offset or converging with the first source flow centerline.

Figure 7:
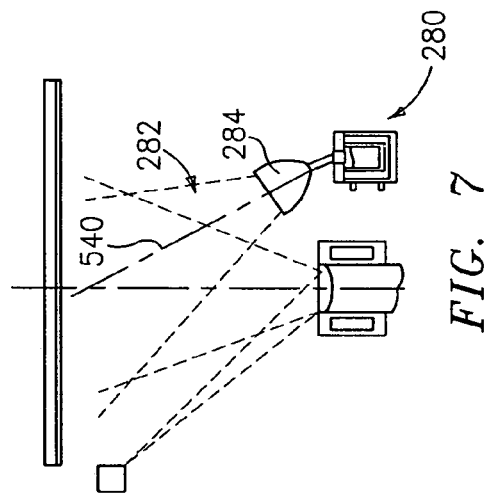
FIG. 7 is a partially schematic view of a sixth deposition apparatus.

FIG. 7 shows a system wherein the second source 280 discharges an OMC flow 282 from a supersonic nozzle 284. The flow 282 has a centerline 540 which, in the exemplary embodiment, is off-parallel to and intersecting with the first source centerline. Such a system may provide a collimation of the second source flow. The second source flow may be more narrow or wide in accordance with the workpiece dimensions.

One more alternate system may comprise irradiation of the deposition surface by an electron beam to cause electron beam-induced dissociation of the one or more organometallic compounds for providing one or more second components of the deposition material. Such non-thermal dissociation may be performed with or instead thermal dissociation and may provide control of dissociation range.

Exemplary process parameters may vary based upon the substrate material, deposition material, substrate geometry, and apparatus capacities. For an exemplary deposition of an Ni-based material with 11-12% Co, 12-14% Cr, 7-8% Al, 1.5-2.5% Ti, 2-4% Mo, 10-12% W, 0.1-0.3% C, an operating temperature of the part may be 800-1050 C, more narrowly 850-100 C. Carbonyl source temperature may be 45-90 C, more narrowly 50-75 C. Electron beam current may be 1.7-2.5 A, more narrowly 1.8-2.2 A. Chamber pressures may be less than 0.01 Pa. Deposition rates may be 5-30 µm/min, more narrowly 15-20 µm/min.

One or more embodiments of the present invention have been described. Nevertheless, it will be understood that various modifications may be made without departing from the spirit and scope of the invention. For example, although particularly useful with high pressure turbine blades, the methods may be applied to other blades and other turbine engine parts and non-turbine parts. Details of the particular turbine engine part or other piece and the particular wear or damage suffered may influence details of any given restoration. The methods and apparatus may be used for various non-repair applications. Accordingly, other embodiments are within the scope of the following claims.

What is claimed is:

1. A method for depositing a deposition material on a part comprising:
   placing the part in a deposition chamber;
   vaporizing one or more first components for forming the deposition material by electron beam heating; and
   vaporizing one or more organometallic compounds for providing one or more second components of the deposition material being codeposited on the part with the first components, wherein:
   the part has lost first material from a site; and
   the deposition material is deposited to the site so as to replace the lost first material.

2. The method of claim 1 wherein:
   the vaporizing one or more organometallic compounds is via a chemical vapor deposition process.

3. The method of claim 1 wherein:
   the one or more first components and one or more second components condense on the part.

4. The method of claim 1 further comprising:
   actively controlling a temperature of the part to, in turn, control dissociation of the one or more organometallic compounds.

5. The method of claim 4 wherein:
   the temperature of the part is maintained between 600 C and 1050 C; and
   the vaporizing of the one or more organometallic compounds comprises heating to between 45 C and 120 C.

6. The method of claim 4 further comprising:
   heat treating the part so as to homogenize the deposited deposition material.

7. The method of claim 1 wherein:
   the one or more organometallic compounds comprise, at least 50% by weight, carbonyls of one or more refractory elements.

8. The method of claim 1 wherein:
the vaporizing of the one or more first components comprises vaporizing at least one M-Cr—Al—Ti alloy; and
the deposition material consists essentially of a nickel- or cobalt-based superalloy.

9. The method of claim 1 wherein:
the one or more first components consist in major part of Ti; and
the one or more second components consist essentially of Mo.

10. The method of claim 1 wherein the deposition material consists essentially of:
at least one of a nickel-or cobalt-based superalloy with 1-20%, by weight, refractory metal addition.

11. The method of claim 1 wherein the deposition material consists essentially of:
at least one M-Cr—Al—Ti alloy;
2-20%, by weight, combined of one or more of W, Mo, Re, Pt, Rh, Ru, Os, Ir, Te, and V; and
0-3%, by weight, C.

12. The method of claim 1 wherein:
the deposition material has a first interface with a substrate of the part, a bond strength between the deposition material and the substrate being in excess of 50 ksi.

13. The method of claim 1 wherein:
the part and the deposition material comprise nickel- or cobalt-based superalloys of like nominal composition and having 2-20%, by weight, refractory metal;
the bond strength is between 60 ksi and 90 ksi;
the deposition material has a depth of at least 2.0 mm at the site on the part;
the substrate has a thickness in excess of the depth of the deposition material; and
the substrate comprises original unrepaired material.

14. The method of claim 1 wherein:
the part and the deposition material comprise nickel- or cobalt-based superalloys of like nominal composition and having 2-20%, by weight, refractory metal;
the bond strength is between 60 ksi and 90 ksi;
the deposition material has an average depth of less than 0.75 mm;
the substrate has a thickness in excess of the depth of the deposition material; and
the substrate comprises original unrepaired material.

15. The method of claim 1 further comprising:
applying a mask to a portion of the part surrounding the site prior to deposition; and
removing the mask after the deposition.

16. The method of claim 1 wherein:
the vaporized one or more organometallic compounds are permitted to condense on the part and the deposition material deposited on the part is irradiated via an electron beam to cause electron beam-induced dissociation of the one or more organometallic compounds leaving one or more refractory metals as said one or more second components.

17. The method of claim 1 wherein:
the part is a gas turbine engine part.

18. A method for codepositing one or more first components and one or more second components comprising:
electron beam physical vapor deposition of the one or more first components; and
chemical vapor deposition of the one or more second components from an organometallic compounds, wherein:
the one or more first components and one or more second components are codeposited on a worn or damaged gas turbine engine part to restore the part.

19. The method of claim 18 wherein the one or more first components comprise, by weight:
at least 50% of one or a combination of Ni, Co, and Fe;
at least 12% Cr;
at least 6% Al; and
at least 0.5% Ti.

20. The method of claim 18 wherein:
the one or more first components are from a single ingot; and
the one or more second components are at least two refractory metal components from at least two different sources of different composition.

21. The method of claim 18 wherein:
the one or more first components include:
at least 50%, by weight, Ti; and
the one or more second components consist essentially of:
one or more refractory metals and up to 0.1%, by weight, C.

22. The method of claim 18 wherein:
the one or more first components comprise at least 50%, by weight, Ti; and
the one or more second components consist essentially of Mo.

23. The method of claim 18 used to deposit deposition material consisting essentially of:
at least one of a nickel-or cobalt-based superalloy with 1-20%, by weight, refractory metal addition.

24. The method of claim 18 used to deposit deposition material consisting essentially of:
at least one M-Cr—Al—Ti alloy;
2-20%, by weight, combined of one or more of W, Mo, Re, Pt, Rh, Ru, Os, Ir, Te, and V; and
0-0.3%, by weight, C.

25. A method for depositing a deposition material on a part comprising:
placing the part in a deposition chamber;
vaporizing one or more first components for forming the deposition material by electron beam heating; and
vaporizing one or more organometallic compounds for providing one or more second components of the deposition material being codeposited on the part with the first components;
actively controlling a temperature of the part to, in turn, control dissociation of the one or more organometallic compounds, the actively controlling comprising irradiating the deposition material deposited on the part via an electron beam to cause electron beam-induced dissociation of the one or more organometallic compounds leaving one or more refractory metals as said one or more second components; and
heat treating the part so as to homogenize the deposited deposition material.

26. The method of claim 25 wherein:
the temperature of the part is maintained between 600 C and 1050 C; and
the vaporizing of the one or more organometallic compounds comprises heating to between 45 C and 120 C.

27. A method for depositing a deposition material on a part comprising:
placing the part in a deposition chamber;
vaporizing one or more first components for forming the deposition material by electron beam heating; and
vaporizing one or more organometallic compounds for providing one or more second components of the deposition material being codeposited on the part with the first components, wherein:

the one or more organometallic compounds comprise, at least 50% by weight, carbonyls of one or more refractory elements.

28. A method for depositing a deposition material on a part comprising:
    placing the part in a deposition chamber;
    vaporizing one or more first components for forming the deposition material by electron beam heating; and
    vaporizing one or more organometallic compounds for providing one or more second components of the deposition material being codeposited on the part with the first components, wherein:
    the vaporizing of the one or more first components comprises vaporizing at least one M-Cr—Al—Ti alloy; and
    the deposition material consists essentially of a nickel- or cobalt-based superalloy.

29. A method for depositing a deposition material on a part comprising:
    placing the part in a deposition chamber;
    vaporizing one or more first components for forming the deposition material by electron beam heating; and
    vaporizing one or more organometallic compounds for providing one or more second components of the deposition material being codeposited on the part with the first components, wherein:
    the one or more first components consist in major part of Ti; and
    the one or more second components consist essentially of Mo.

30. A method for depositing a deposition material on a part comprising:
    placing the part in a deposition chamber;
    vaporizing one or more first components for forming the deposition material by electron beam heating; and
    vaporizing one or more organometallic compounds for providing one or more second components of the deposition material being codeposited on the part with the first components, wherein the deposition material consists essentially of:
    at least one of a nickel-or cobalt-based superalloy with 1-20%, by weight, refractory metal addition.

31. A method for depositing a deposition material on a part comprising:
    placing the part in a deposition chamber;
    vaporizing one or more first components for forming the deposition material by electron beam heating; and
    vaporizing one or more organometallic compounds for providing one or more second components of the deposition material being codeposited on the part with the first components, wherein the deposition material consists essentially of:
    at least one M-Cr—Al—Ti alloy;
    2-20%, by weight, combined of one or more of W, Mo, Re, Pt, Rh, Ru, Os, Ir, Te, and V; and
    0-0.3%, by weight, C.

32. A method for codepositing one or more first components and one or more second components comprising:
    electron beam physical vapor deposition of the one or more first components; and
    chemical vapor deposition of the one or more second components from an organometallic compound,
    wherein the one or more first components comprise, by weight:
    at least 50% of one or a combination of Ni, Co, and Fe;
    at least 12% Cr;
    at least 60% Al; and
    at least 0.5% Ti.

33. A method for codepositing one or more first components and one or more second components comprising:
    electron beam physical vapor deposition of the one or more first components; and
    chemical vapor deposition of the one or more second components from an organometallic compound, wherein:
    the one or more first components are from a single ingot; and
    the one or more second components are at least two refractory metal components from at least two different sources of different composition.

34. A method for depositing a deposition material on a part comprising:
    placing the part in a deposition chamber;
    vaporizing one or more first components for forming the deposition material by electron beam heating; and
    vaporizing one or more organometallic compounds for providing one or more second components of the deposition material being codeposited on the part with the first components, wherein:
    the part is a gas turbine engine part.

35. A method for codepositing one or more first components and one or more second components comprising:
    electron beam physical vapor deposition of the one or more first components; and
    chemical vapor deposition of the one or more second components from an organometallic compound, wherein:
    the one or more first components include:
    at least 50%, by weight, Ti; and
    the one or more second components consist essentially of:
    one or more refractory metals and up to 0.1%, by weight, C.

36. A method for codepositing one or more first components and one or more second components comprising:
    electron beam physical vapor deposition of the one or more first components; and
    chemical vapor deposition of the one or more second components from an organometallic compound, wherein:
    the one or more first components comprise at least 50%, by weight, Ti; and
    the one or more second components consist essentially of Mo.

37. A method for codepositing one or more first components and one or more second components comprising:
    electron beam physical vapor deposition of the one or more first components; and
    chemical vapor deposition of the one or more second components from an organometallic compound, wherein the method is used to deposit deposition material consisting essentially of:
    at least one of a nickel-or cobalt-based superalloy with 1-20%, by weight, refractory metal addition.

38. A method for codepositing one or more first components and one or more second components comprising:
    electron beam physical vapor deposition of the one or more first components; and
    chemical vapor deposition of the one or more second components from an organometallic compound, wherein the method is used to deposit deposition material consisting essentially of:
    at least one M-Cr—Al—Ti alloy;
    2-20%, by weight, combined of one or more of W, Mo, Re, Pt, Rh, Ru, Os, Ir, Te, and V; and 0-0.3%, by weight, C.

* * * * *

UNITED STATES PATENT AND TRADEMARK OFFICE
CERTIFICATE OF CORRECTION

PATENT NO. : 7,404,986 B2
APPLICATION NO. : 10/840859
DATED : July 29, 2008
INVENTOR(S) : Alexander V. Makhotkin et al.

It is certified that error appears in the above-identified patent and that said Letters Patent is hereby corrected as shown below:

In column 9, claim 11, line 20, delete "0-3%" and insert --0-0.3%--.

In column 9, claim 18, line 64, delete "compounds" and insert --compound--.

Signed and Sealed this

Fourth Day of November, 2008

JON W. DUDAS
*Director of the United States Patent and Trademark Office*